(12) United States Patent
Singleton

(10) Patent No.: US 7,237,724 B2
(45) Date of Patent: Jul. 3, 2007

(54) SMART CARD AND METHOD FOR MANUFACTURING A SMART CARD

(76) Inventor: Robert Singleton, 2910 Barrett Ave., Plant City, FL (US) 33566

( * ) Notice: Subject to any disclaimer, the term of this patent is extended or adjusted under 35 U.S.C. 154(b) by 0 days.

(21) Appl. No.: 11/099,477

(22) Filed: Apr. 6, 2005

(65) Prior Publication Data

US 2006/0226240 A1 Oct. 12, 2006

(51) Int. Cl.
*G06K 19/06* (2006.01)
*G06K 19/02* (2006.01)
*H05K 3/30* (2006.01)
*H01R 43/00* (2006.01)
*B29C 45/14* (2006.01)

(52) U.S. Cl. .................. 235/492; 235/488; 29/841; 29/827; 264/272.11

(58) Field of Classification Search ............... 235/492, 235/441, 380, 493, 384, 488, 451; 442/232; 428/32.6; 29/827, 841, 858, 856; 264/272.11, 264/272.15

See application file for complete search history.

(56) References Cited

U.S. PATENT DOCUMENTS

| | | | |
|---|---|---|---|
| 4,339,407 A | 7/1982 | Leighton | |
| 4,501,787 A * | 2/1985 | Marchetti et al. | 442/232 |
| 4,686,358 A * | 8/1987 | Seckinger et al. | 235/382 |
| 4,961,893 A | 10/1990 | Rose | |
| 5,244,840 A | 9/1993 | Kodai et al. | |
| 5,350,553 A | 9/1994 | Glaser et al. | |
| 5,399,847 A * | 3/1995 | Droz | 235/488 |
| 5,417,905 A | 5/1995 | Lemaire et al. | |
| 5,423,705 A | 6/1995 | Solomon, II | |
| 5,498,388 A | 3/1996 | Kodai et al. | |
| 5,510,074 A | 4/1996 | Rose | |
| 5,690,773 A | 11/1997 | Fidalgo et al. | |
| 5,955,021 A | 9/1999 | Tiffany, III | 264/272.11 |
| 6,025,054 A | 2/2000 | Tiffany, III | |
| 6,206,291 B1 * | 3/2001 | Droz | 235/488 |
| 6,241,153 B1 | 6/2001 | Tiffany, III | 235/488 |
| 6,256,873 B1 | 7/2001 | Tiffany, III | 29/827 |
| 6,404,643 B1 | 6/2002 | Chung | |
| 2002/0179721 A1 * | 12/2002 | Elbaz et al. | 235/492 |
| 2004/0031856 A1 * | 2/2004 | Atsmon et al. | 235/492 |
| 2005/0168339 A1 * | 8/2005 | Arai et al. | 235/492 |
| 2005/0276934 A1 * | 12/2005 | Fukui et al. | 428/32.6 |
| 2006/0162156 A1 | 7/2006 | Reed | 29/841 |

FOREIGN PATENT DOCUMENTS

AU 726884 3/2001
CA 2289728 6/2001

(Continued)

*Primary Examiner*—Jared J. Fureman
*Assistant Examiner*—Thien T. Mai
(74) *Attorney, Agent, or Firm*—Foley & Lardner LLP

(57) ABSTRACT

A smart card and a method for manufacturing the same wherein the smart card is composed of a printed circuit board, having a top surface and a bottom surface, a plurality of circuit components attached to the top surface of the printed circuit board, a filler board, attached to the top surface of the printed circuit board, a bottom overlay attached to the bottom surface of the printed circuit board, a top overlay positioned above the top surface of the printed circuit board and a thermosetting polymeric layer positioned between the top surface of the printed circuit board and the top overlay.

5 Claims, 5 Drawing Sheets

FOREIGN PATENT DOCUMENTS

| | | |
|---|---|---|
| EP | 0 350 179 A1 | 1/1990 |
| EP | 0 488 574 B1 | 6/1992 |
| EP | 488574 A2 * | 6/1992 |
| EP | 0 669 597 A1 | 8/1995 |
| WO | WO 02/076717 A2 | 10/2002 |
| WO | WO 2006/080929 | 8/2006 |
| WO | WO 2006/101493 | 9/2006 |

* cited by examiner

SMART CARD AND METHOD FOR MANUFACTURING A SMART CARD

BACKGROUND OF THE INVENTION

Generally, smart cards may be used as credit cards, bankcards, ID cards, telephone cards, security cards or similar devices. Smart cards are generally constructed by assembling several layers of plastic sheets in a sandwich array. Further, smart cards contain electronic components that enable the smart card to perform a number of functions.

European Patent 0 350 179 discloses a smart card wherein electronic circuitry is encapsulated in a layer of plastic material that is introduced between the card's two surface layers. The method further comprises abutting a high tensile strength holding member against a side of a mould, locating the smart card's electronic components with respect to that side and then injecting a reaction moldable polymeric material into the mould such that it encapsulates the electronic components.

European Patent Application 95400365.3 teaches a method for making contact-less smart cards. The method employs a rigid frame to position and fix an electronic module in a void space between an upper thermoplastic sheet and a lower thermoplastic sheet. After the frame is mechanically affixed to the lower thermoplastic sheet, the void space is filled with a polymerizable resin material.

U.S. Pat. No. 5,399,847 teaches a credit card that is comprised of three layers, namely, a first outer layer, a second outer layer and an intermediate layer. The intermediate layer is formed by injection of a thermoplastic binding material that encases the smart card's electronic elements (e.g., an IC chip and an antenna) in the intermediate layer material. The binding material is preferably made up of a blend of copolyamides or a glue having two or more chemically reactive components that harden upon contact with air. The outer layers of this smart card can be made up of various polymeric materials such as polyvinyl chloride or polyurethane.

U.S. Pat. No. 5,417,905 teaches a method for manufacturing plastic credit cards wherein a mold tool comprised of two shells is closed to define a cavity for producing such cards. A label or image support is placed in each mold shell. The mold shells are then brought together and a thermoplastic material injected into the mold to form the card. The inflowing plastic forces the labels or image supports against the respective mold faces.

U.S. Pat. No. 5,510,074 teaches a method of manufacturing smart cards having a card body with substantially parallel major sides, a support member with a graphic element on at least one side, and an electronic module comprising a contact array that is fixed to a chip. The manufacturing method generally comprises the steps of: (1) placing the support member in a mold that defines the volume and shape of the card; (2) holding the support member against a first main wall of the mold; (3) injecting a thermoplastic material into the volume defined by the hollow space in order to fill that portion of the volume that is not occupied by the support member; and (4) inserting an electronic module at an appropriate position in the thermoplastic material before the injected material has the opportunity to completely solidify.

U.S. Pat. No. 4,339,407 discloses an electronic circuit encapsulation device in the form of a carrier having walls that have a specific arrangement of lands, grooves and bosses in combination with specific orifices. The mold's wall sections hold a circuit assembly in a given alignment. The walls of the carrier are made of a slightly flexible material in order to facilitate insertion of the smart card's electronic circuitry. The carrier is capable of being inserted into an outer mold. This causes the carrier walls to move toward one another in order to hold the components securely in alignment during the injection of the thermoplastic material. The outside of the walls of the carrier has projections that serve to mate with detents on the walls of the mold in order to locate and fix the carrier within the mold. The mold also has holes to permit the escape of trapped gases.

U.S. Pat. No. 5,350,553 teaches a method of producing a decorative pattern on, and placing an electronic circuit in, a plastic card in an injection molding machine. The method comprises the steps of: (a) introducing and positioning a film (e.g., a film bearing a decorative pattern), over an open mold cavity in the injection molding machine; (b) closing the mold cavity so that the film is fixed and clamped in position therein; (c) inserting an electronic circuit chip through an aperture in the mold into the mold cavity in order to position the chip in the cavity; (d) injecting a thermoplastic support composition into the mold cavity to form a unified card; and (e) thereafter, removing any excess material, opening the mold cavity and removing the card.

U.S. Pat. No. 4,961,893 teaches a smart card whose main feature is a support element that supports an integrated circuit chip. The support element is used for positioning the chip inside a mold cavity. The card body is formed by injecting a plastic material into the cavity so that the chip is entirely embedded in the plastic material. In some embodiments, the edge regions of the support are clamped between the load bearing surfaces of the respective molds. The support element may be a film that is peeled off the finished card or it may be a sheet that remains as an integral part of the card. If the support element is a peel-off film, then any graphics elements contained therein are transferred and remain visible on the card. If the support element remains as an integral part of the card, then such graphics elements are formed on a face thereof and, hence, are visible to the card user.

U.S. Pat. No. 5,498,388 teaches a smart card device that includes a card board having a through opening. A semiconductor module is mounted onto this opening. A resin is injected into the opening so that a resin molding is formed under such condition that only an electrode terminal face for external connection of said semiconductor module is exposed. The card is completed by mounting a card board having a through opening onto a lower mold of two opposing molding dies, mounting a semiconductor module onto the opening of said card board, tightening an upper die that has a gate leading onto a lower die and injecting a resin into the opening via the gate.

U.S. Pat. No. 5,423,705 teaches a disc having a disc body made of a thermoplastic injection molded material and a laminate layer that is integrally joined to a disc body. The laminate layer includes an outer clear lamina and an inner white and opaque lamina. An imaging material is sandwiched between these lamina.

U.S. Pat. No. 6,025,054 discloses a method for constructing a smart card using low shrinkage glue to hold the electronic devices in place during the devices immersion in thermosetting material that becomes the core layer of the smart card.

Generally, all of the above methods for making smart cards are concerned with properly positioning and fixing electronic components, modules or assemblies inside the smart card. If the electronic components are not properly affixed they will be moved to random positions when a thermoplastic material is injected into a card-forming, or card core-forming, cavity under the influence of rather high thermoset material injection pressures. The prior art noted above reveals use of various solid holding members such as frames or supports that are often used to position and fix the electronic elements during the thermoplastic injection processes. The use of relatively large, mechanical holding devices having hard, sharply defined, bodies to hold their electronic components in place during injection of such thermosetting materials has, however, created certain problems. For example, the bodies of these relatively large holding devices (i.e., large relative to the electronic components they hold) are often adversely affected by those shock, flexure and/or torsion forces the card may encounter in normal (and abnormal) use. In order to minimize the damage caused by such forces, the electronic components held by some of these hard, sharply defined bodies are often positioned in a corner of such smart cards. This positioning limitation usually cuts down on the size and number of electronic components that can be placed in such cards.

Moreover, due to differences in the coefficient of expansion of the materials used to make these relatively large holding devices—relative to the coefficient of expansion of the other elements of such cards—deformations often appear on the external surfaces of finished cards that contain such electronic component holding devices. Deformations may prevent the card from lying completely flat in the card-receiving receptacles in certain card reading machines.

Some smart card manufacturers have dealt with this problem by reducing the size and/or body of such holding devices by using various glues (rather than mechanical interconnecting locking devices) to securely position their holders (and hence the electronic component that they hold) in their card-forming cavities during the thermoplastic injection process. However, the use of such glues to secure these holder devices has produced another set of problems.

U.S. Pat. No. 6,025,054 discloses a method for constructing smart cards using cured, low shrinkage glues to position and hold electronic elements during injection of a thermosetting material that forms the core layer of the card. The method disclosed in U.S. Pat. No. 6,025,054 has considerable drawbacks. Primarily, the disclosed method produces warping and other undesirable physical defects caused by the curing of thermosetting material. Further, this method is suitable only for cards having one or two components, thus limiting its functionality. In addition, the method disclosed in U.S. Pat. No. '054 creates defects such as voids and air bubbles within a smart card because the geometric shapes of the electronic components within the card obstruct the flow of the thermosetting material such that the thermosetting material flows around the components faster than the air can be pushed out of the core of the smart card. Moreover, U.S. Pat. No. '054 requires the use of custom equipment, significantly limiting the scope and scalability of its application.

In view of the following, there is a need for a smart card and a method of constructing the smart card that is capable of housing numerous electrical components without exhibiting warping and other undesirable physical defects.

SUMMARY OF THE INVENTION

According to one embodiment of the invention, a smart card comprises a printed circuit board, having a top surface and a bottom surface, a plurality of circuit components attached to the top surface of the printed circuit board, a filler board, attached to the top surface of the printed circuit board, a bottom overlay attached to the bottom surface of the printed circuit board, a top overlay positioned above a top surface of the filler board and a core layer positioned between the filler board, the plurality of circuit components and the top overlay.

According to another embodiment of the present invention, a method for manufacturing a smart card comprises providing a printed circuit board having a top surface and a bottom surface, with circuit traces on the top surface of the printed circuit board, attaching filler board having a plurality of openings to the top surface of the printed circuit board, inserting a plurality of circuit components into the plurality of filler board openings, attaching the bottom surface of the printed circuit board to a bottom overlay, loading the printed circuit board and bottom overlay into an injection molding apparatus, loading a top overlay positioned above a top surface of the filler board into the injection molding apparatus and injecting thermosetting polymeric material between filler board, the plurality of circuit components and the top overlay.

It is to be understood that both the foregoing general description and the following detailed description are exemplary and explanatory only, and are not restrictive of the invention as claimed.

BRIEF DESCRIPTION OF THE DRAWINGS

These and other features, aspects and advantages of the present invention will become apparent from the following description, appended claims, and the accompanying exemplary embodiments shown in the drawings, which are briefly described below.

DETAILED DESCRIPTION

Embodiments of the present invention will be described below with reference to the accompanying drawings. It should be understood that the following description is intended to describe exemplary embodiments of the invention, and not to limit the invention.

Figure 1:
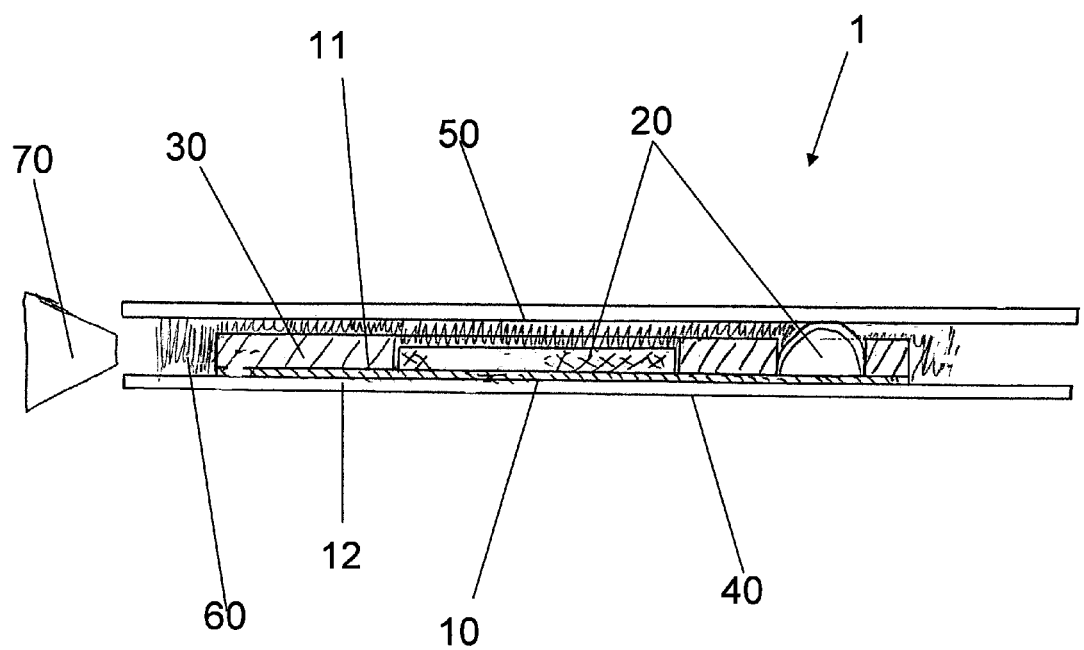
FIG. 1 is a sectional view of a smart card according to one embodiment of the present invention.

According to one embodiment of the present invention, as shown in FIG. 1, the smart card 1 comprises a printed circuit board 10, a plurality of circuit components 20, a filler board 30, a bottom overlay 40, a top overlay 50 and a core layer 60.

The printed circuit board has a top surface 11 and a bottom surface 12. The printed circuit board is comprised of any known conventional material suitable for receiving an electronic circuit. For example, the printed circuit board may be comprised of a flame retardant laminate with a woven glass reinforced epoxy resin. This material is also known as FR-4 board. Alternatively, the printed circuit board may be comprised of a plastic compound that is suitable for receiving conductive ink. As shown in FIG. 1 and described below, the printed circuit board 10 is configured to receive and vertically stabilize a plurality of circuit components 20.

Figure 4:
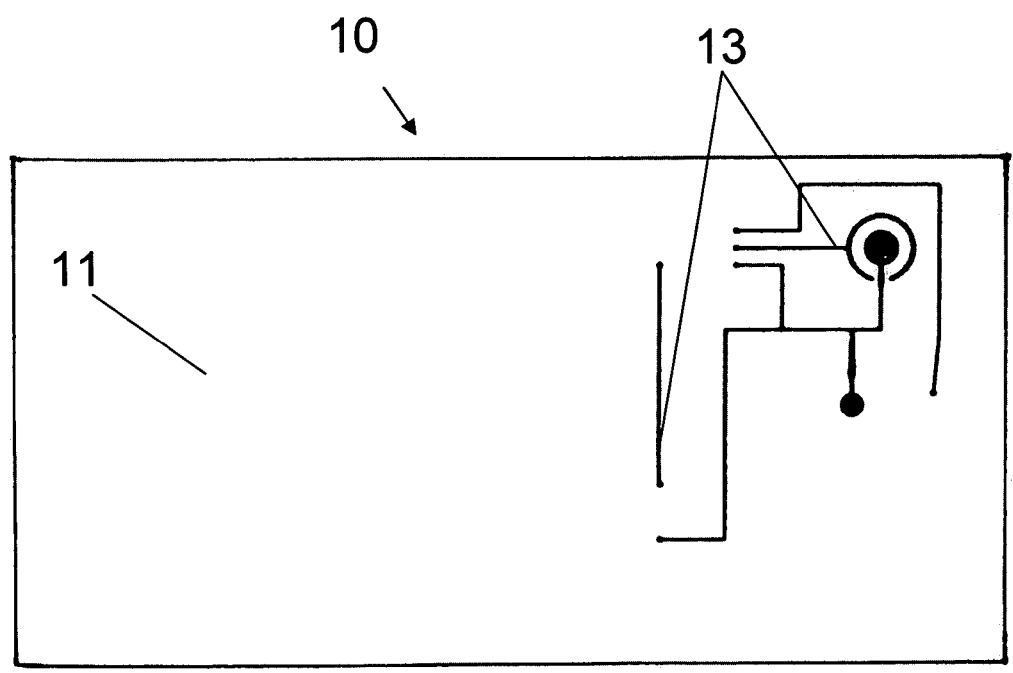
FIG. 4 is a top view of a printed circuit board.

A plurality of circuit traces 13 (shown in FIGS. 2, 4 and 5) reside on the top surface 11 of the printed circuit board 10.

The circuit traces 13 are configured to contact the plurality of circuit components 20. The circuit traces 13 electrically connect to the plurality of circuit components 20 such that the circuit components 20 are capable of performing electrical functions within the smart card 1. The circuit traces 13 may be formed on the printed circuit board 10 by anyone of a number of methods. For example, the circuit traces 13 may be formed on the printed circuit board 10 by an etching process where conductive material is etched to form the traces 13. As another example, the circuit traces 13 may be formed on the printed circuit board 10 with conductive ink.

A filler board 30 is attached to the top surface 11 of the printed circuit board 10. The filler board 30 may be attached to the printed circuit board 10 using any one of a number of methods. According to one embodiment of the invention, the filler board 30 is attached to the top surface 11 of the printed circuit board 10 using a heated lamination process. In another embodiment of the invention, the filler board 30 is attached to the top surface 11 of the printed circuit board 10 using a pressure lamination process.

Figure 3:
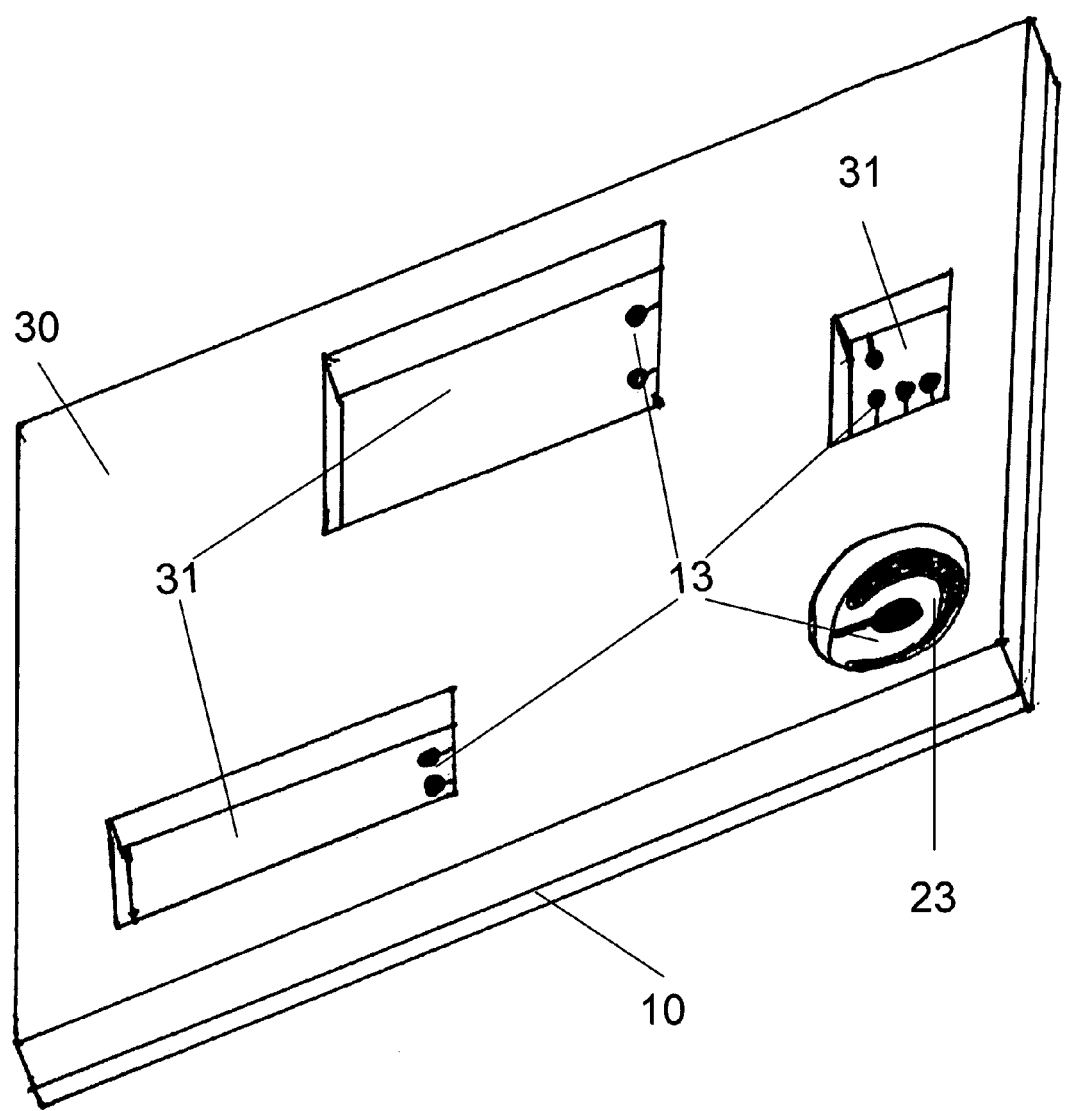
FIG. 3 is a perspective view of a filler board affixed to a printed circuit board.

As seen in FIGS. 1 and 3, the filler board 30 is significantly thicker than the printed circuit board 10. In some cases, the filler board 30 may have a thickness greater than that of one of the plurality of circuit components 20. The thickness of the filler board 30 reduces the thickness variation within the smart card 1 once a core layer (comprised of thermosetting polymeric material) 60 is injected between the top overlay 50 and the bottom overlay 40. In turn, warping and other physical defects that may occur during the setting or curing of the thermosetting polymeric material are minimized. Preferably, the filler board 30 has a thickness in the range of 0.010 inches to 0.016 inches. The filler board may be composed of any suitable material. For example, the filler board may be composed of flame retardant laminate with woven glass reinforced epoxy resin. This material is well known in the industry as FR-4 board.

Figure 5:
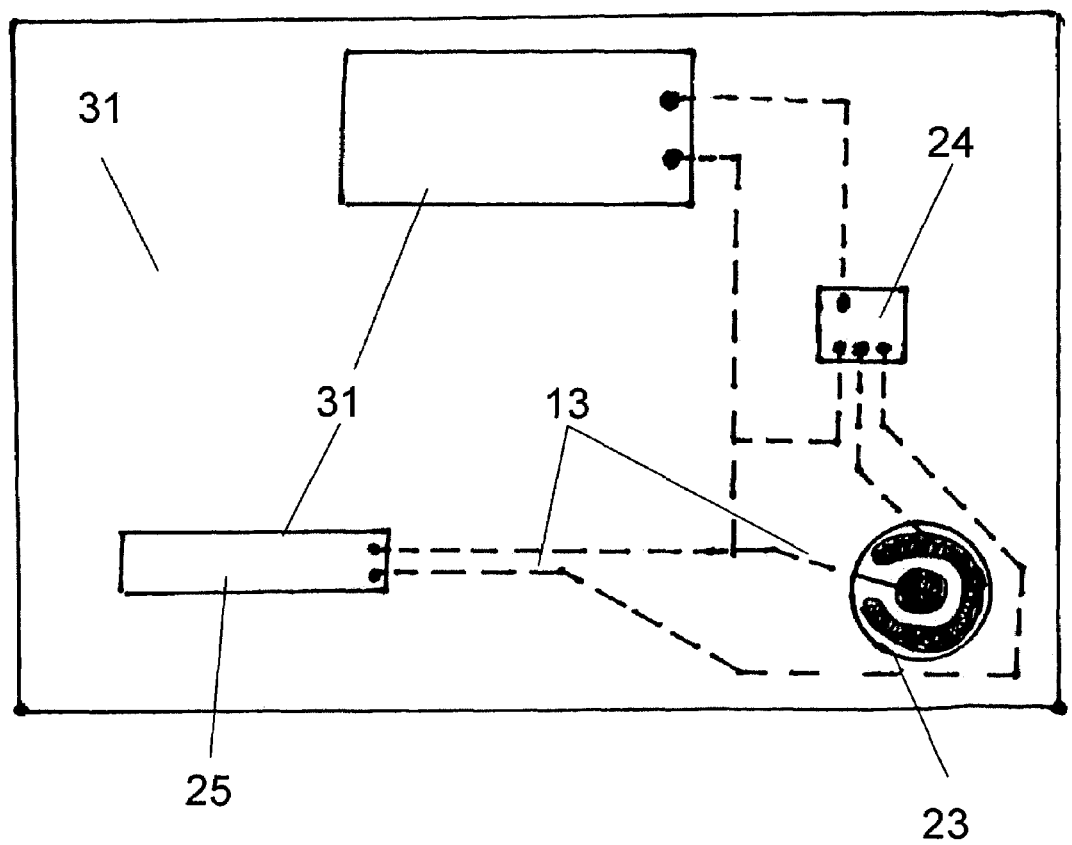
FIG. 5 is a top view of a filler board affixed to a printed circuit board.

As shown in FIGS. 3 and 5, according to one embodiment of the present invention, the filler board 30 has a plurality of openings 31. The openings 31 are configured so that when the filler board 30 is attached to the printed circuit board 10, portions of the circuit traces 13 on the top surface 11 of the printed circuit board 10 are exposed. Generally, the portions of the circuit traces 13 that are left exposed are leads that will electrically connect to one of a plurality of circuit components 20. Each of the plurality of openings 31 is shaped so that a corresponding circuit component 20 fits in the opening 31 and may contact the exposed circuit traces 13.

As described above, a plurality of circuit components 20 are attached to the top surface 11 of the printed circuit board 10. As shown in FIG. 1, the circuit components 20 are positioned within the filler board openings 31 so that they come in direct contact with the plurality of circuit traces 13 on the printed circuit board 10. The circuit components 20 may be attached to the printed circuit board 10 and more specifically to the circuit traces 13 by any one of a number of methods. For example, in one embodiment of the invention, the circuit components 20 are connected to the printed circuit board 10 with a conductive adhesive. Preferably, the circuit components 20 are soldered onto the printed circuit board 10. The plurality of circuit components 20 can be positioned anywhere on the printed circuit board 10 as desired. The purpose of the smart card 1 and design parameters will dictate the position of the circuit traces 13 and the position of the circuit components 20. Functionality will also dictate what types of circuit components 20 populate the printed circuit board 10.

Figure 2:
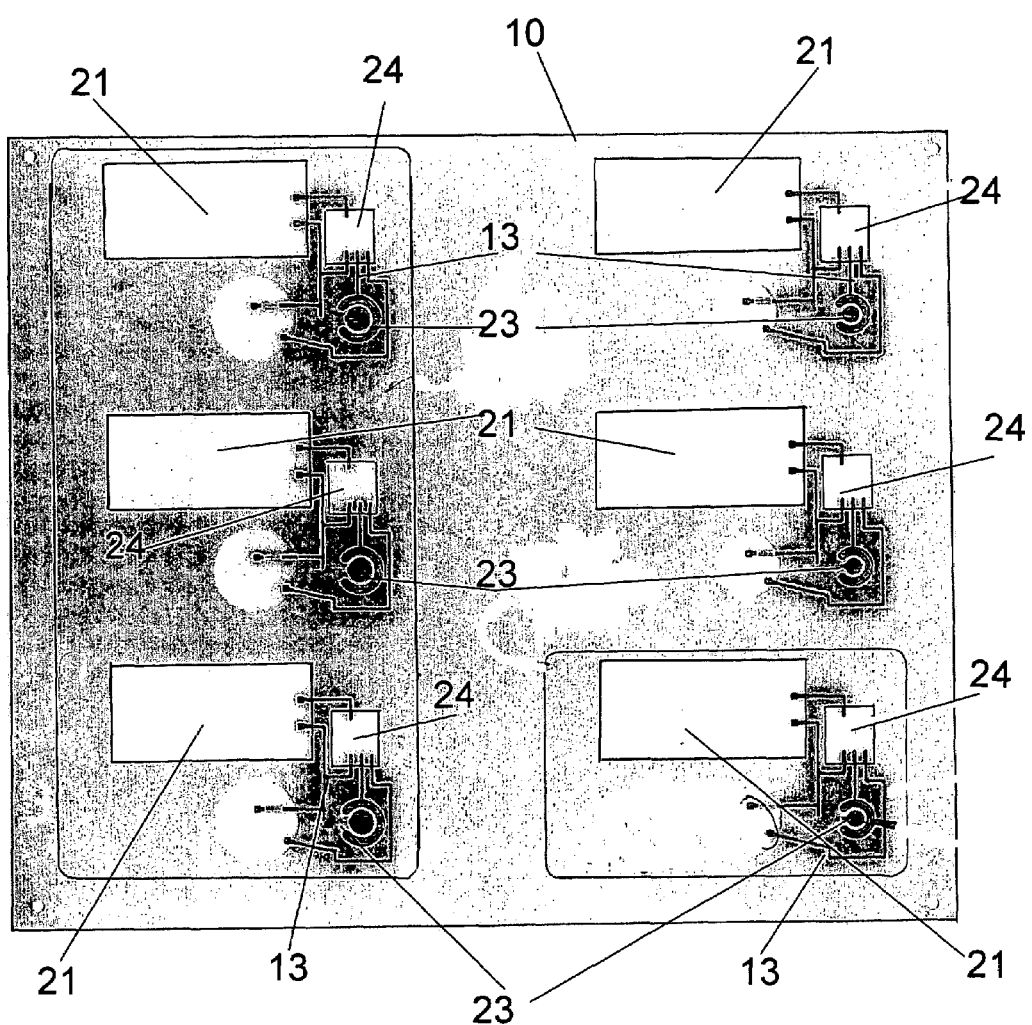
FIG. 2 is a top sectional view of a series of smart cards formed on one molded sheet according to one embodiment of the present invention.

For example purposes only, the plurality of circuit components 20 could be one of a battery, a button, a microprocessor chip or a speaker. Any one or all these circuit components could populate the printed circuit board 10. Further, additional circuit components 20 may include but are not limited to LEDs, flexible displays, RFID antennas, and emulators. Referring to FIG. 2, a circuit layout for a smart card 1 is shown. The printed circuit board 10 shown in FIG. 2 is populated by a battery 21, a microprocessor chip 22 and a button 23 for turning the circuit on and off. A circuit component 20 may be connected to the other end of the button 23. In another embodiment of the present invention as shown in FIG. 5, the smart card 1 includes a liquid crystal display 25 as the circuit component 20 connected to the button 23. The liquid crystal display 25 may be used to display information to a user, such as an account balance. In the alternative or in addition to, the smart card 1 shown in FIG. 2 may include a speaker (not shown).

Generally, the components shown in FIG. 2 may vary in thickness and length. For example purposes only, the battery 21 has a thickness of 0.016 inches, the push button 23 has a thickness of 0.020 inches and the microchip 22 has a thickness of 0.015 inches. In addition, the smart card 1 shown in FIG. 2 could have a speaker (not shown) having a thickness of 0.010 inches.

As shown in FIG. 1, a bottom overlay 40 is attached to the bottom surface of the printed circuit board 10. The bottom overlay 40 can be attached to the printed circuit board 10 by any number of known methods. For example, the bottom overlay 40 may be laminated to the bottom surface of the printed circuit board 10. The lamination may be performed by either heat or pressure lamination processes. The bottom overlay 40 may be comprised of any suitable material but preferably, the bottom overlay 40 is comprised of polyvinyl chloride (PVC) or like material. According to one embodiment of the invention, the surface of the bottom overlay 40 in contact with the printed circuit board 10 has printed information. For example, the bottom overlay 40 may include printed information consistent with a standard credit card, including a name, expiration date and account number.

A top overlay 50 positioned above the top surface of the printed circuit board 10 is shown in FIG. 1. The top overlay 50 may be comprised of any suitable material, for example, the top overlay 50 may comprise of polyvinyl chloride (PVC) or like material. According to one embodiment of the invention, the surface of the top overlay 50 in contact with the thermosetting polymeric layer 60 has printed information. For example, the top overlay 50 may include printed information consistent with a standard credit card, including a name, expiration date and account number.

As shown in FIG. 1, a core layer 60 is positioned between the top surface of the printed circuit board 10 and the top overlay 50. Preferably, the core layer 60 is composed of a thermosetting polymeric material. Due to its bonding and adhesive properties, a core thermosetting polymeric layer 60 integrates the top overlay 50 with the remaining components to form a smart card 1.

The preferred thermosetting materials are polyurethane, epoxy and unsaturated polyester polymeric materials. Specifically, polyurethanes made by condensation reactions of isocyanate and a polyol derived from propylene oxide or trichlorobutylene oxide are preferred. Of the various polyesters that can be used, those that can be further characterized as being "ethylenic unsaturated" are particularly preferred because of their ability to be cross linked through their double bonds with compatible monomers (also containing ethylene unsaturation) and with the materials out of which the top 50 and bottom 40 overlays are made. The more preferred epoxy materials for use in the practice of this invention will be those made from epichlorohydrin and bisphenol A, or epichlorohydrin, and an aliphatic polyol (such as glycerol). They are particularly preferred because of their ability to bond with some of the more preferred materials (e.g., polyvinyl chloride) out of which the top 50 and bottom 40 layers may be made.

A method for manufacturing a smart card according to the present invention will now be described.

First, a printed circuit board 10 is provided. The printed circuit board 10 has a top surface 11 and a bottom surface 12. Circuit traces 13 are present on the top surface 11 of the printed circuit board.

Next, a filler board 30 is attached to the top surface 11 of the printed circuit board. Preferably, the filler board 30 is laminated on the top surface 11 of the printed circuit board 10. The filler board 30 has a plurality of openings 31 configured to respectively receive a plurality of circuit components 20. A plurality of circuit components 20 are then inserted into the corresponding plurality of filler board openings 31. While being placed in the filler board openings 31 the plurality of circuit components 20 may be further electrically connected to the circuit traces 13 on the top surface 11 of the printed circuit board 10. The circuit components 20 may be connected by any one of several methods including the use of double-sided electrically conducting tape. Preferably, the plurality of circuit components 20 are connected via a conventional soldering process.

Next, the bottom surface of the printed circuit board 10 is attached to a bottom overlay 40. Preferably, the bottom surface 12 of the printed circuit board 10 is laminated to the bottom overlay 40. It should be noted that the bottom overlay 40 may be attached to the printed circuit board 10 before the filler board 30 is attached to the printed circuit board. In the alternative, the bottom overlay 40 may be attached to the printed circuit board 10 after the filler board 30 is attached to the printed circuit board 10 and the circuit components 20 are placed in the filler board openings 31.

The printed circuit board 10, attached to the bottom overlay 40, with the filler board 30 and plurality of circuit components 20 is then loaded as one complete sheet into an injection molding apparatus. A top overlay 50 is placed into the injection molding apparatus and positioned such that the top overlay 50 is above the top surface 11 of the filler board 30. Specifically, the injection molding apparatus may be a reaction injection molding machine (which is often individually referred to as "RIM"). These machines are associated with a top mold shell and a bottom mold shell that are capable of performing cold, low pressure, forming operations on at least one of the sheets of polymeric material (e.g., PVC) that make up the top 50 and bottom 40 overlay. Such top and bottom mold shells cooperate in ways that are well known to those skilled in the polymeric material molding arts.

The injection molding apparatus then injects thermosetting polymeric material via a nozzle 70 (shown in FIG. 1) between the top overlay and the bottom overlay 40 forming the core layer 60 from thermosetting polymeric material.

Cold, low pressure forming conditions generally mean forming conditions wherein the temperature of the core layer 60 consisting of thermosetting polymeric material, is less than the heat distortion temperature of the top 50 and bottom 40 overlays, and the pressure is less than about 500 psi. Preferably, the cold forming temperatures will be at least 100° F. less than the heat distortion temperature of the top 50 and bottom 40 overlays. The heat distortion temperature of many polyvinyl chloride (PVC) materials is about 230 degrees F. Thus, the temperatures used to cold form such PVC sheets in the present invention will be no more than about (230° F.-100° F.) 130° F.

According to one embodiment of the invention, the more preferred cold, low pressure forming procedures will involve injection of thermosetting polymeric materials with temperatures ranging from about 56° F. to about 160° F., under pressures that preferably range from about atmospheric pressure to about 500 psi. In another embodiment of the invention, the temperatures of the thermosetting polymeric material being injected into the smart card 1 will be between about 65° F. and about 70° F. under injection pressures that preferably range from about 80 to 120 psi. In a one embodiment of the invention, the liquid or semi-liquid thermosetting polymeric material will be injected under these preferred temperature and pressure conditions at flow rates ranging from about 0.1 to about 50 grams/second/card-forming cavity. Flow rates of 1.5 to 1.7 gram s/seconds/card-forming cavity are even more preferred.

It should be noted that the use of such relatively cold, low pressure, forming conditions may require that any given gate (i.e., the passageway that connects a runner with each individual card-forming cavity) be larger than those gates used in prior art, hot, high pressure operations. Preferably, the gates are relatively larger than prior art gates so that they are able to quickly pass the thermosetting polymeric material being injected under applicant's cold, low pressure forming conditions. Similarly, the runner (i.e., the main thermosetting polymeric material supply passageway in the mold system that feeds from the source of the thermosetting material to each individual gate), will normally be in a multi-gate or manifold array, and, hence, should be capable of simultaneously supplying the number of gates/card forming cavities (e.g., 4 to 8 cavities) in the manifold system at the relatively cold temperature (e.g., 56° F. to 160° F.) and relatively low pressure (e.g., atmospheric pressure to 500 psi) conditions used in applicant's process. The flow rates for the polymeric thermosetting material under the low temperature and pressure conditions are able to completely fill a given card-forming cavity in less than or about 10 seconds per card-forming cavity (and more preferably in less than about 3 seconds). Preferably, card-forming cavity fill times of less than 1 second are even more preferred. In view of these conditions, the processes may employ gates having a width that is a major fraction of the length of a leading edge of the card to be formed (that is, a card edge that is connected to a gate). Preferably, the width of a given gate is about 20 percent to about 200 percent of the width of the leading edge (or edges—multiple gates can be used to fill the same card-forming cavity), i.e., the "gated" edge(s), of the smart card being formed.

Preferably, gates are employed that are tapered down from a relatively wide inflow area to a relatively narrow core region that ends at or near the leading edge(s) of the card body being formed. Most preferably, these gates will narrow down from a relatively wide diameter (e.g., from about 5 to about 10 mm) injection port that is in fluid connection with the thermosetting material-supplying runner, to a relatively thin diameter (e.g., 0.10 mm) gate/card edge where the gate feeds the thermosetting material into the void space which ultimately becomes the center or core of the finished smart card 1. Gates that taper from an initial diameter of about 7.0 millimeters down to a minimum diameter of about 0.13 mm will produce especially good results under the preferred cold, low-pressure injection conditions.

Another optional feature that can be used is the use of mold shells that have one or more receptacles for receiving "excess" polymeric material that may be purposely injected into the void space between the top 50 and bottom 40 layers in order to expunge any air and/or other gases (e.g., those gases formed by the exothermic chemical reactions that occur when the ingredients used to formulate most polymeric thermoset materials are mixed together) from said void space. These thermoset ingredients are preferably mixed just prior to (e.g., about 30 seconds before) their injection into the void space.

As seen in FIG. 1, the filler board 30 reduces the thickness variation caused by the curing of the thermosetting polymeric material after injection around the plurality of circuit components 20. The molded structure is then removed from the injection molded apparatus. According to one embodiment of the invention, several smart cards 1 are cut out of one molded sheet. FIG. 2 depicts several smart cards formed on one sheet. According to another embodiment of the invention, the injected sheet corresponds to a single smart card 1. The stiffness of the smart card 1 will depend upon the materials used in the composition of each of the smart cards 1 individual components.

The finished smart cards 1 are then removed from the excess polymeric materials (e.g., by trimming them off of the precursor card body) and cut to certain prescribed sizes (e.g., 85.6 mm by 53.98 mm as per ISO Standard 7810) dependent upon the functionality and design parameters of the smart card 1. The trimming process may also remove the excess material in one cutting/trimming operation. It also will be well appreciated by those skilled in this art that the molding devices used to make such cards in commercial production operations will most preferably have mold shells having multiple cavities (e.g., 2, 4, 6, 8, etc.) for making several such cards simultaneously.

The present invention has several advantages including a cost effective manner to produce one or more smart cards. Most of the modules in the smart card 1 can be constructed in a traditional manner that reduces manufacturing costs. Further, the printed circuit board 10 and filler board construction 30 enable greater protection to circuit components 20 during manufacturing which in turn lowers production costs and raises production output. Moreover, the method of the present invention can be easily adapted to produce multiple smart cards at once.

The foregoing description of a preferred embodiment of the invention has been presented for purposes of illustration and description. It is not intended to be exhaustive or to limit the invention to the precise form disclosed, and modifications and variations are possible in light of the above teaching or may be acquired from practice of the invention. The embodiment was chosen and described in order to explain the principles of the invention and as a practical application to enable one skilled in the art to utilize the invention in various embodiments and with various modification are suited to the particular use contemplated. It is intended that the scope of the invention be defined by the claims appended hereto and their equivalents.

What is claimed is:

1. A method for manufacturing a smart card, comprising:
providing a printed circuit board having a top surface and a bottom surface, with circuit traces on the top surface of the printed circuit board;
attaching filler board having a plurality of openings to the top surface of the printed circuit board;
inserting a plurality of circuit components into the plurality of filler board openings;
attaching the bottom surface of the printed circuit board to a bottom overlay;
loading the printed circuit board and bottom overlay into an injection molding apparatus;
loading a top overlay positioned above a top surface of the filler board into the injection molding apparatus; and
injecting thermosetting polymeric material between the top surface of the filler board, the plurality of circuit components and the bottom overlay.

2. The method of claim 1, wherein a plurality of smart cards are formed on one printed circuit board.

3. The method of claim 2, further comprising: removing the injected top and bottom overlay from the mould; and cutting out the plurality smart cards.

4. The method of claim 1, wherein the circuit traces are formed by etching traces into the printed circuit board.

5. The method of claim 1 wherein the inserting step further comprises connecting each of the plurality of circuit components to the top surface of the printed circuit board.

\* \* \* \* \*